United States Patent
Belady et al.

(10) Patent No.: US 8,762,702 B2
(45) Date of Patent: *Jun. 24, 2014

(54) AUTOMATICALLY STARTING SERVERS AT LOW TEMPERATURES

(71) Applicant: Microsoft Corporation, Redmond, WA (US)

(72) Inventors: Christian L. Belady, Mercer Island, WA (US); Eric C. Peterson, Woodinville, WA (US); Harry R. Rogers, Santa Clara, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/749,270

(22) Filed: Jan. 24, 2013

(65) Prior Publication Data

US 2013/0138935 A1    May 30, 2013

Related U.S. Application Data

(63) Continuation of application No. 12/790,464, filed on May 28, 2010, now Pat. No. 8,364,940.

(51) Int. Cl.
     *G06F 9/00*      (2006.01)

(52) U.S. Cl.
     USPC .................. 713/2; 713/1; 713/100; 702/130; 700/300

(58) Field of Classification Search
     USPC ................ 713/1, 2, 100; 702/130; 700/300
     See application file for complete search history.

(56) References Cited

U.S. PATENT DOCUMENTS

| | | | |
|---|---|---|---|
| 5,860,002 A | 1/1999 | Huang | |
| 6,169,930 B1 * | 1/2001 | Blachek et al. | 700/79 |
| 6,338,150 B1 | 1/2002 | Johnson et al. | |
| 6,859,882 B2 | 2/2005 | Fung | |
| 7,043,650 B2 | 5/2006 | Bresniker et al. | |
| 7,100,041 B2 | 8/2006 | Garnett | |
| 7,191,347 B2 | 3/2007 | Bigelow et al. | |
| 7,203,021 B1 * | 4/2007 | Ryan et al. | 360/75 |
| 7,400,945 B2 | 7/2008 | Radhakrishnan et al. | |
| 7,898,221 B2 * | 3/2011 | Owens | 320/136 |
| 8,364,940 B2 * | 1/2013 | Belady et al. | 713/1 |
| 2006/0112286 A1 | 5/2006 | Whalley et al. | |
| 2009/0228893 A1 | 9/2009 | Behrendt et al. | |
| 2010/0070745 A1 | 3/2010 | Chiu | |
| 2011/0296155 A1 | 12/2011 | Belady et al. | |

OTHER PUBLICATIONS

"Non-Final Office Action", U.S. Appl. No. 12/790,464, (Feb. 16, 2012), 5 pages.
"Notice of Allowance", U.S. Appl. No. 12/790,464, (Sep. 20, 2012), 4 pages.
"Supplemental Notice of Allowance", U.S. Appl. No. 12/790,464, (Oct. 11, 2012), 5 pages.

\* cited by examiner

*Primary Examiner* — M Elamin
(74) *Attorney, Agent, or Firm* — Jim Sfekas; Kate Drakos; Micky Minhas

(57) ABSTRACT

This document describes various techniques for automatically starting servers at low temperatures. A server may be powered on into a heating mode responsive to determining that a temperature of the server is below an operational temperature range. The server may then be restarted when the temperature of the server has increased to a temperature that is within the operational temperature range.

19 Claims, 7 Drawing Sheets

AUTOMATICALLY STARTING SERVERS AT LOW TEMPERATURES

RELATED APPLICATION

This application is a continuation of and claims priority under 35 U.S.C. §120 to U.S. patent application Ser. No. 12/790,464, filed on May 28, 2010, now U.S. Pat. No. 8,364,940, the disclosure of which is incorporated by reference herein in its entirety.

BACKGROUND

Many computer servers operate best within an operational temperature range of 50 to 95 degrees Fahrenheit. When a server is operated at a temperature below the operational temperature range timing errors and damage to server components may occur. As the industry moves towards more-aggressive economization, such as housing servers in containers that use outside air for heating and cooling, there is an increasing need to start servers at temperatures that are below the normal operational temperature range since no alternate heating mechanism is available. Conventional heating systems, such as those that use heating elements or forced-air heat, are costly or can cause temperature gradients that may damage server components.

SUMMARY

This document describes various techniques for automatically starting servers at low temperatures. A server may be powered on into a heating mode responsive to determining that a temperature of the server is below an operational temperature range. In the heating mode, server components that may be safely operated at low temperatures may be selectively powered on to heat the server. The server may then be restarted into a full operational boot when the temperature of the server has increased to a temperature that is within the operational temperature range. In some embodiments these techniques may be used to start multiple servers in a container of servers when a temperature in the container is below the operational temperature range.

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit of a reference number identifies the figure in which the reference number first appears. The use of the same reference number in different instances in the description and the figures may indicate similar or identical items.

DETAILED DESCRIPTION

Overview

This document describes various techniques for automatically starting servers at low temperatures. A server may be powered on into a heating mode responsive to determining that a temperature of the server is below an operational temperature range. In the heating mode, server components that may be safely operated at low temperatures may be selectively powered on to heat the server. The power dissipated by the server components in the heating mode increases the temperature of the server to a temperature that is within its operational temperature range. The server may then be automatically restarted into a full operational boot when the temperature of the server has increased to a temperature that is within the operational temperature range.

Example Environment

Figure 1:
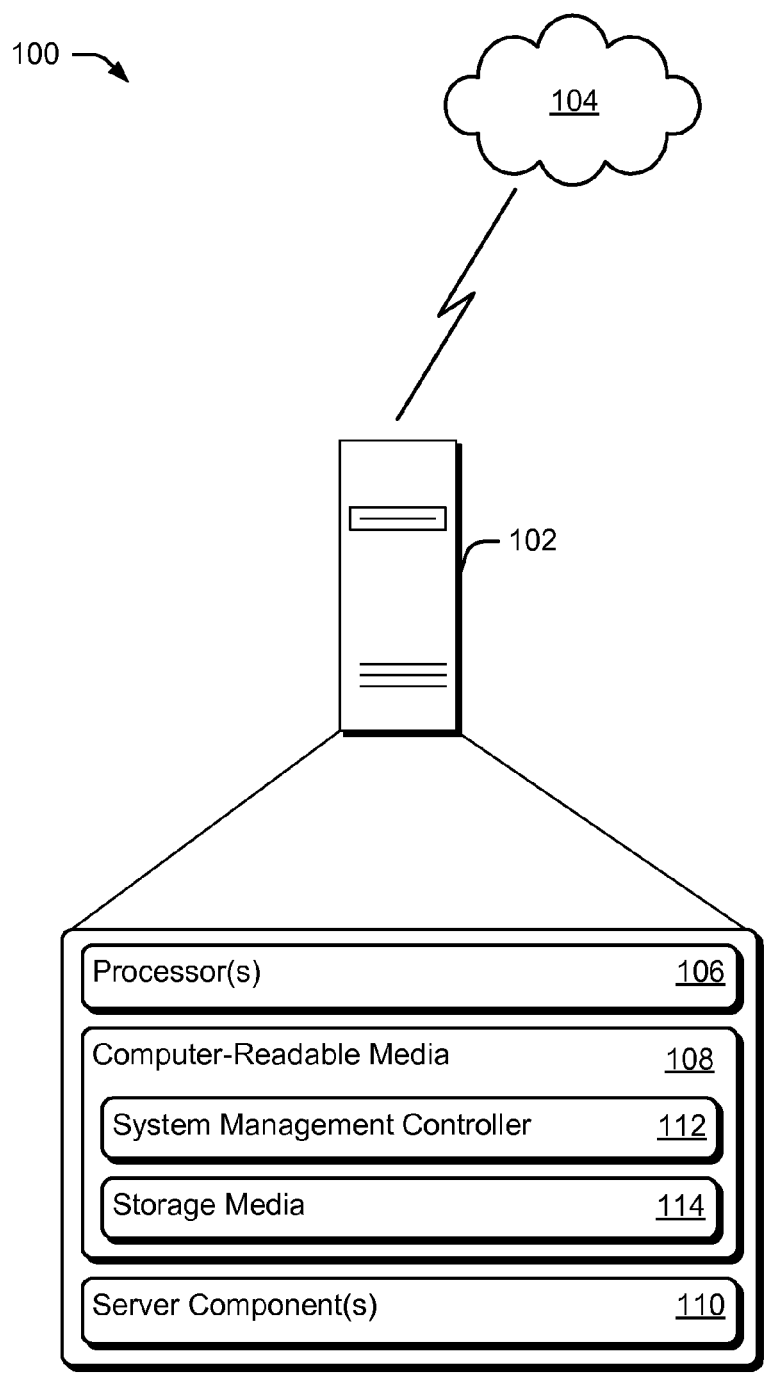
FIG. 1 illustrates an example operating environment.

FIG. 1 is an illustration of an example environment 100 having a server 102 and a communication network 104 through which server 102 may communicate. While server 102 is described and illustrated as a server, server 102 may be any device capable of communicating over a network (e.g., communication network 104), writing data to a storage medium, and/or reading from a storage medium or any combination thereof. For instance, server 102 may comprise, by way of example and not limitation, a desktop computer, a mobile computer, or a mobile device. Communication network 104 may include any suitable network such as the Internet, a local-area network, a wide-area network, a wireless-network, a personal-area network, a dial-up network, and/or a USB bus, to name a few.

Server 102 includes processor(s) 106, computer-readable media (CRM) 108, and server component(s) 110. Server component(s) 110 may include, by way of example and not limitation, CPUs, dual in-line memory modules (DIMMs), storage media (e.g., solid state drives (SDD) or rotating storage media such as hard disk drives), clocks, power supplies, processors, memories, and any other server motherboard components. Computer-readable media 108 contains system management controller 112 and storage media 114. System management controller 112 is described as part of the processes discussed below. Storage media 114 includes internal and/or external (but local) memory and is capable of storing data.

Generally, any of the techniques and abilities described herein can be implemented using software, firmware, hardware (e.g., fixed-logic circuitry), manual processing, or any suitable combination of these implementations. The example server 102 generally represents software, firmware, hardware or any combination thereof. In the case of a software implementation, for instance, system management controller 112 represents computer-executable instructions (e.g., program code) that perform specific tasks when executed on a processor (e.g., CPU or CPUs). The program code can be stored in one or more computer-readable memory devices, such as computer readable media 108 and/or storage media 114. The features and techniques described herein are platform-independent, meaning that they may be implemented on a variety of commercial computing platforms having a variety of processors.

Example Processes

The following discussion describes techniques for automatically starting a server in low temperatures. Generally, these techniques enable server components that may be safely operated at low temperatures to be selectively powered on into a heating mode to heat the server. For example, system management controller 112 may determine a temperature of server 102 via one or more temperature sensors located on the server. System management controller 112 may then send commands to power on one or more server component(s) 110 into a heating mode to heat the server responsive to determining that the temperature of the server is below an operational temperature range. In the heating mode, the power dissipated by server component(s) 110 heats the server to a temperature that is within the operational temperature range. System management controller 112 may then automatically restart server 102 when the temperature is within the operational temperature range.

Aspects of these processes may be implemented in hardware, firmware, software, or a combination thereof. These processes are shown as sets of blocks that specify operations performed, such as through one or more entities or devices, and are not necessarily limited to the order shown for performing the operations by the respective blocks. In portions of the following discussion reference may be made to environment 100 of FIG. 1.

Figure 2:
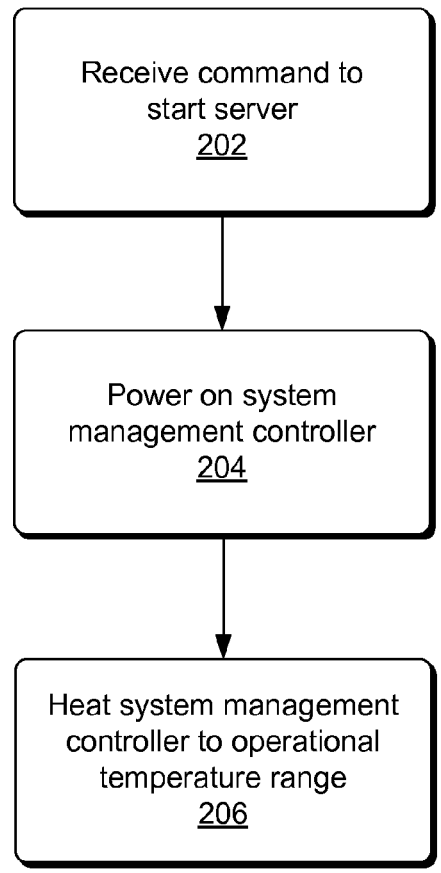
FIG. 2 is a flow diagram depicting an example process for automatically powering on a system management controller.

FIG. 2 is a flow diagram depicting an example process 200 for automatically starting a system management controller. For example, system management controller 112 may be automatically started to control the automatic start-up of server 102.

Block 202 receives a command to start a server. The command may be received by a system management controller that is configured to control the automatic start-up of the server. The system management controller may be configured to operate at temperatures that are below the normal operational temperature range of the server. In this way, the system management controller may initiate the automatic start-up of the server in low temperatures at which the server cannot safely operate. The system management controller may warm up the server by powering on one or more server components into a heating mode, as described in more detail below. By way of example, consider process 200 in the context of environment 100. In this context, system management controller 112 receives the command to start server 102 at block 202.

Block 204 powers on the system management controller. In general, the system management controller may be automatically powered on in low temperatures to control the automatic start-up of the server. In extreme cold temperatures, however, the temperature may be too low for the system management controller to be safely started without risking damage to the controller. In these instances the system management controller may be heated to a safe power-on temperature range by a small resistive heating device before the controller is started. For example, a small glow plug embedded on the system management controller may be used to generate heat to quickly heat the controller to a temperature at which the controller may be safely powered on. Continuing with the ongoing example, system management controller 112 powers on when the temperature is at a safe power-on temperature. In instances where the temperature is below a safe power-on temperature, system management controller 112 is heated to a safe power-on temperature prior to powering on.

Block 206 heats the system management controller to an operational temperature range. In some embodiments the controller may be able to heat itself. For example, a thermostatic device may be used to hold the system management controller in reset to heat the controller using the power dissipated from the controller itself. Continuing with the ongoing example, system management controller 112 heats itself to its operational temperature range after it is powered on. After the system management controller is powered on and heated to its operational temperature range, the controller may be used to initiate the automatic start-up of the server, which is discussed below.

Figure 3:
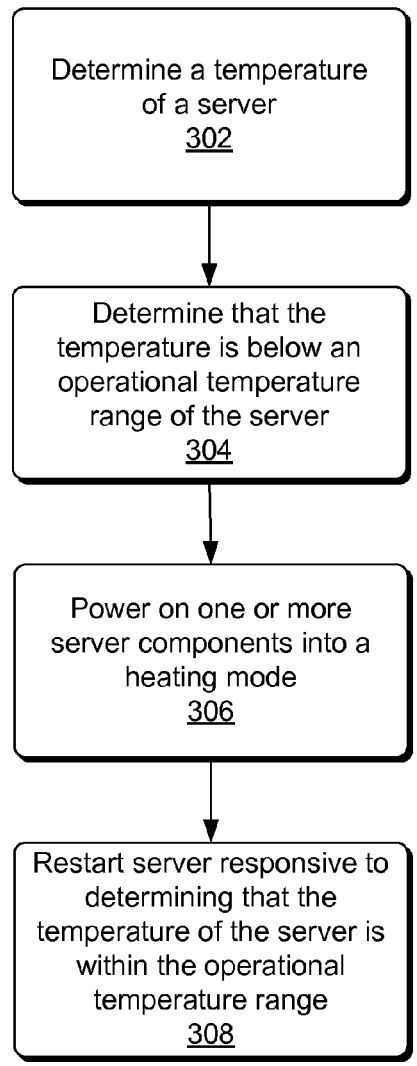
FIG. 3 is a flow diagram depicting a first example process for automatically starting a server.

FIG. 3 is a flow diagram depicting an example process 300 for automatically starting a server. Process 300, for example, may be implemented by system management controller 112, once powered on and heated to its operational temperature range as described above, to automatically initiate the start-up of server 102.

Block 302 determines a temperature of a server. The temperature of the server may be determined using information received from one or more temperature sensors. The temperature sensors may be configured to sense a temperature of the server itself and/or a temperature associated with the server, such as an ambient air temperature of a room in which the server is located. Alternately or additionally, the temperature sensors may be configured to individually sense a chip temperature of one or more server components. For instance, a temperature sensor may be associated with an individual server component, such as the processor, and configured to sense a chip temperature of the individual server component.

By way of example, consider process 300 in the context of the above-mentioned example. Here system management controller 112 determines a temperature of server 102 using temperature information received from one or more temperature sensors located on server 102.

Block 304 determines that the temperature is below an operational temperature range of the server. The operational temperature range of the server is the temperature range in which the server may safely operate without errors and without damaging server components. As described herein, the operational temperature range may refer to the ambient air temperature and/or the chip temperature in which the server may safely operate. If a server is operated when one or more of its components are below their specified operating temperature, damage to the server or components may occur. For example, rotating media, such as hard disk drives, can be damaged when turned on at temperatures below the operational temperature range. Additionally, server errors, such as timing errors, may occur when a server is operated at a temperature below the operational temperature range of the server.

Note that the operational temperature range includes a minimum operational temperature (the lowest temperature at which the server may be safely operated) and a maximum operational temperature (the highest temperature at which the server may be safely operated). Conventionally, for example, the ambient operational temperature range of a server typically has a minimum operational temperature of 50 degrees Fahrenheit and a maximum operational temperature of 90 degrees Fahrenheit. It is to be appreciated that the chip operational temperature range is typically much higher than the ambient operational temperature range. A processor, for example, may operate with a chip temperature of 160° F.

Server components, however, may each have different associated operational temperature ranges that overlap. Because a server often relies on all server components to fully operate, the server may be unable to safely operate without errors unless the temperature is within the operational temperature range of every server component of the server. In some embodiments, therefore, the minimum operational temperature of a server is equal to the minimum operational temperature of the server component with the highest minimum operational temperature. Similarly, the maximum ambient operational temperature that a server operates is limited by the ambient temperature at which any component exceeds its maximum allowable specification.

Consider, for example, a server that includes a first server component and a second server component. In this example, assume that the first server component has an operational temperature range of 50 to 125° F. and that the second server component has an operational temperature range of 30 to 115° F. In this example, the minimum operational temperature for the server would be 50° F. (the minimum operational temperature of the first server component) because the first server component has the highest minimum operational temperature. The maximum operational temperature, in this example, would be 115° F. (the maximum operational temperature of the second server component) because the second server component has the lowest maximum operational temperature. Therefore, the operational temperature range of this example server would be 50 to 115° F. Note, however, that this example assumes that a component's temperature is the same as that of the ambient temperature, which may or may not be true. In some cases, for example, a particular component may be warmer (or cooler) than other components or the ambient temperature. Thus, it can be true that the ambient temperature is 30° F., the first component is 50° F., and the second component is 30° F. In such a case, the example server can operate.

In some embodiments the server component with the highest minimum operational temperature is rotating media, such as a hard disk drive, because rotating media may be damaged when operated at moderately low temperatures. The minimum operational temperature of the server, therefore, may be the equal to the minimum operational temperature of the rotating storage device.

Information regarding the operational temperature range of the server and each of its components may be stored and accessed by the system management controller (e.g., from storage media 114). In these embodiments the system management controller may be configured to calculate an operational temperature range of the server using the operational temperature range of each server component, as described above. In other words, the system management controller accesses information associated with the operational temperature range of each server component and calculates a minimum operational temperature and a maximum operational temperature. In other embodiments, the operational temperature range of the server may be pre-calculated.

The system management controller is configured to prevent the start-up of the server when the temperature of the server is not within the operational temperature range. At block 304, however, if the system management controller determines that the temperature of the server is already within the operational temperature range of the server, the system management controller skips to block 308 to restart the server thereby ending process 300.

Continuing with the ongoing example, system management controller 112 accesses information regarding the operational temperature range of server 102 from the non-volatile memory of storage media 114. System management controller 112 then determines that the temperature of server 102 determined at block 302 is below the operational temperature of server 102.

Block 306 powers on one or more server components into a heating mode responsive to determining that the temperature is below the operational temperature range of the server. In the heating mode, server components that may be safely operated at low temperatures are selectively powered on to heat the server. The server components dissipate power, which increases the temperature of the server. Server components are used for heating in the heating mode but may not be used for performing computations because the server is not yet fully operational. In other words, the server does not fully operate in the heating mode because only selected server components are turned on. Therefore, various errors may be made by the server in the heating mode because the server is not yet fully operational. In some instances, these errors may be rendered moot by holding critical components, such as CPUs, in a reset mode. Some errors may be ignored, however, as the purpose of the heating mode is to increase the temperature of the server to a temperature that is within the operational temperature range rather than performing computations.

The system management controller determines which components can be powered on into the heating mode based on safe-power-on temperature information stored in memory. In this way, the system management controller selectively powers on only those server components that may safely operate below the server's operating temperature range. As defined herein, the safe power-on temperature is the temperature at which a server component may safely run to generate heat in the heating mode without damaging itself or other server components. A server component can be safely run while generating errors, therefore, so long as data is not permanently lost. A rotating storage device when operated at a temperature below its operational temperature range, for instance, may be permanently damaged or its data may be permanently lost. In contrast, errors (e.g., timing errors) do not permanently affect the server or data stored on the server and may be simply ignored, such as errors that may occur when operating a CPU. Furthermore, any errors that occur during the heating mode may be remedied by simply restarting and booting the server after the server has been heated to its operational temperature.

In some embodiments the system management controller may power on server components into a heating mode by selectively and sequentially powering on server components based on the safe power-on temperature of each server component. For example, power supplies may be powered on early in the process because they generally may be turned on in low temperatures without damaging themselves or other server components. After a server component is powered on into the heating mode, the system management controller may monitor the temperature and selectively and sequentially power on additional server components as the power-on temperature of each additional server component is reached. This process may continue until the temperature of the server increases to a temperature that is within the operational temperature range of the server. A more detailed discussion of selectively and sequentially powering on server components is described in process 500 of FIG. 5 below.

In some embodiments the order in which server components are powered on may be based on additional factors. For instance, the order can be based on the ratio of input power needed to run a server component to the amount of heat generated by the server component when powered on. Server components that generate a large amount of heat with a minimal power input may be powered on early in the process. Conversely, server components that generate a low amount of heat relative to the amount of power required to generate the heat may be powered-on later in the process.

Alternatively or additionally, the system management controller may turn on heaters that are embedded on the server to increase the temperature of the server in the heating mode, such as small resistors embedded on the motherboard of the server.

Continuing with the ongoing example, system management controller 112 powers on one or more server component(s) 110 into a heating mode. Prior to powering on server component(s) 110, system management controller 112 accesses the non-volatile memory of storage media 114 to determine safe power-on temperatures for server component(s) 110. System management controller 112 then selectively powers on server component(s) 110 when the temperature is above the safe power-on temperature of each server component.

Block 308 restarts the server responsive to determining that the temperature of the server is within the operational temperature range. In combination with powering on server components into the heating mode, the system management controller may monitor the temperature of the server. The system management controller may then automatically initiate the restart of the server into a full operational boot when the temperature reaches the operational temperature range. A user, therefore, does not need to manually restart the server after the server has been warmed up. Continuing with the ongoing example, system management controller 112 restarts server 102 with a full operational boot.

Figure 4:
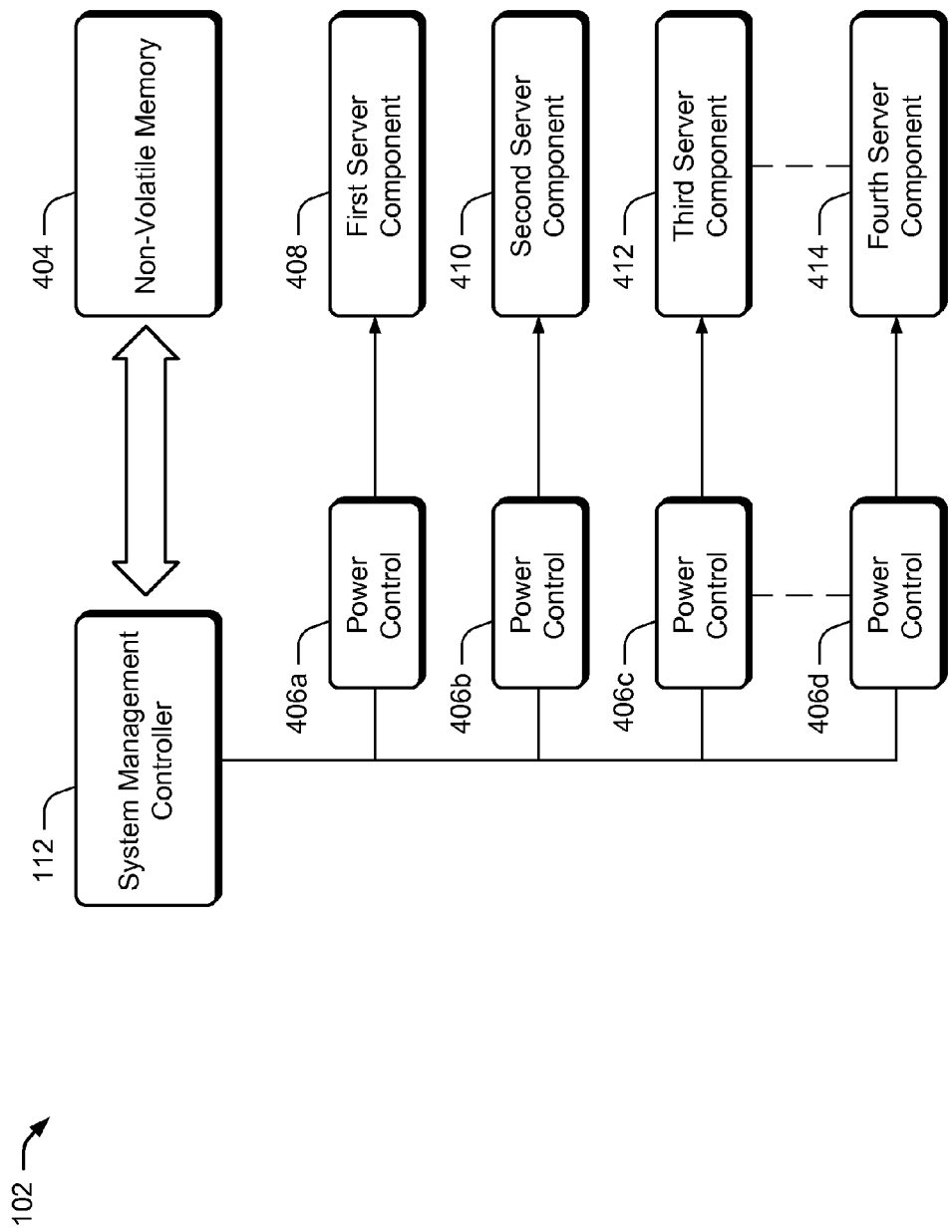
FIG. 4 illustrates an example server in accordance with one or more embodiments.

FIG. 4 illustrates example server 102 of FIG. 1 in more detail. In the illustrated example, server 102 includes system management controller 112 of FIG. 1, which here is configured to access temperature information (e.g., operational temperature range and power-on temperature) from non-volatile memory 404. Responsive to determining that a temperature of server 102 is below an operational temperature range, system management controller 112 may use power controls 406a, 406b, 406c, and 406d to selectively and sequentially power on a first server component 408, a second server component 410, a third server component 412, and/or a fourth server component 414 into a heating mode to heat the server. In this example, server components 408, 410, 412, and 414 may include any combination of server components such as CPUs, DIMMs, power supplies, processors, memories, and rotating storage devices, to name just a few. System management controller 112 may then restart server 102 when the temperature of server 102 is within the operational temperature range.

Figure 5:
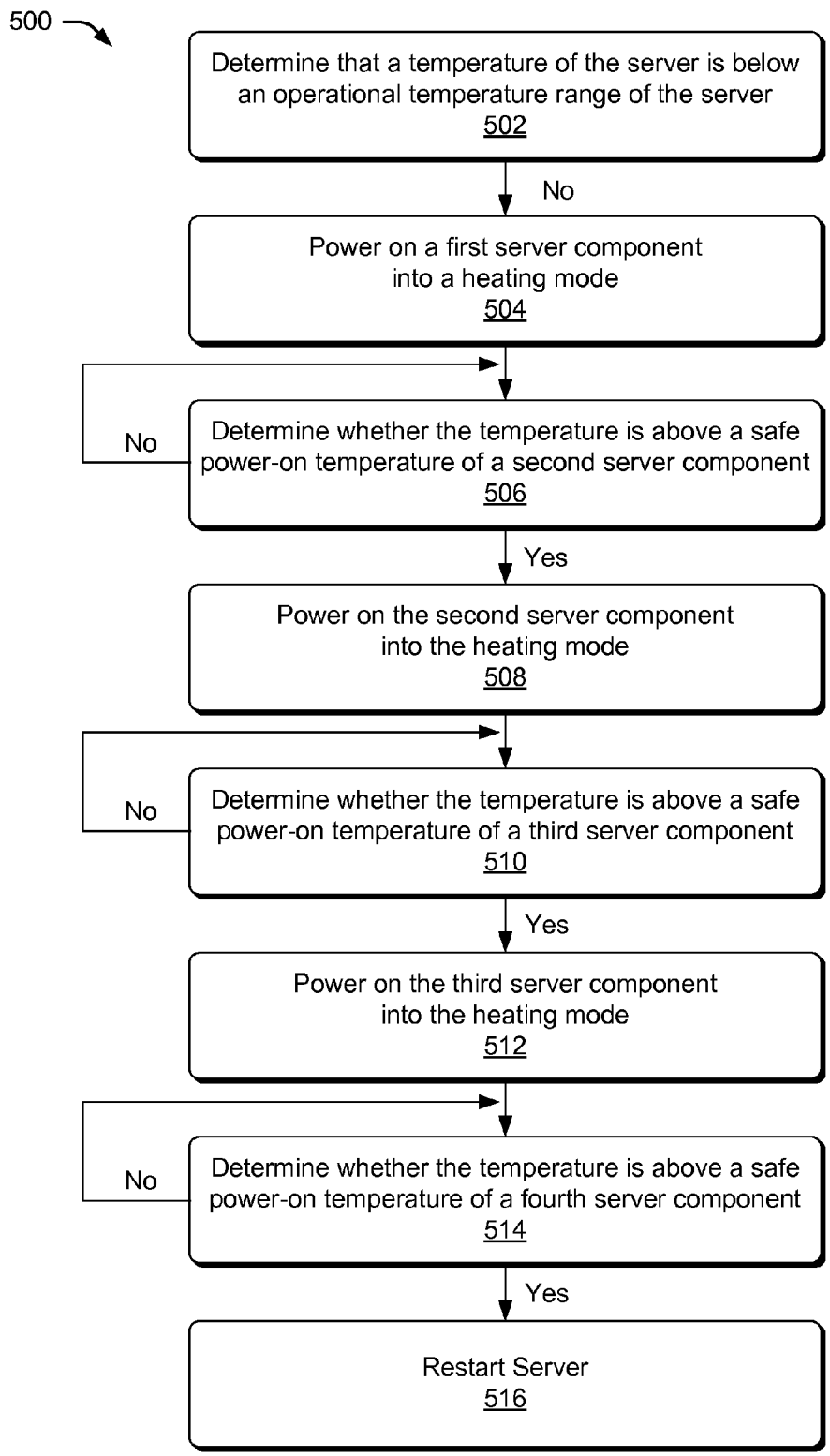
FIG. 5 is a flow diagram depicting a second example process for automatically starting a server.

FIG. 5 is a flow diagram depicting an example process 500 for automatically starting a server. Process 500 selectively and sequentially powers on the server components in the example server 102 of FIG. 5 using an ordered list of server components. The ordered list of server components may be ordered based on the safe power-on temperature of each server component. In this example, the first server component is first in the ordered list because it has the lowest power-on temperature. The first server component is followed by the second server component, the third server component, and the fourth server component in the ordered list. For purposes of this example, assume that the fourth server has an operational temperature that is equal to its minimum operational temperature. Assume also that the fourth server component has the highest minimum operational temperature of the server components. Therefore, the minimum operational temperature of the server is equal to the minimum operational temperature of the fourth server component.

Block 502 determines that a temperature of a server is below an operational temperature range of the server. By way of example, consider process 500 in the context of example server 102 of FIG. 4. System management controller 112 determines, at block 502, that a temperature of server 102 is below an operational temperature range of server 102.

Block 504 powers on a first server component into a heating mode. The first server component, when powered on into the heating mode, dissipates power, which heats the server. In this example process, the first server component is powered on first because it is first in the ordered list by virtue of the fact that is has the lowest safe power-on temperature. Continuing with the ongoing example, system management controller 112 powers on first server component 408 using power control 406a.

Block 506 determines whether the temperature is above a safe power-on temperature of a second server component. Because the components are sequentially ordered based on respective safe power-on temperatures, the system management controller may monitor the temperature of the server until the temperature is above the safe power-on temperature of the second server component. Note that the temperature of the server may increase due to the heat generated by the first server component in the heating mode. Block 508 powers on the second server component into the heating mode responsive to determining that the temperature is above the safe power-on temperature of the second server component. Continuing with the ongoing example, system management controller 112 determines whether the temperature is above the power-on temperature of second server component 410. System management controller 112 then powers on second server component 410 using power control 406b responsive to determining that the temperature is above the safe power-on temperature of the second server component.

Block 510 determines whether the temperature is above a safe power-on temperature of a third server component. Block 512 powers on the third server component into the heating mode responsive to determining that the temperature is above the safe power-on temperature of the third server component. Continuing with the ongoing example, system management controller 112 determines whether the temperature is above the safe power-on temperature of third server component 412. System management controller 112 then powers on third server component 412 using power control 406c responsive to determining that the temperature is above the safe power-on temperature of the third server component.

Block 514 determines whether the temperature is above the safe power-on temperature of a fourth server component. Because there are no other components left to power on besides the fourth server component in this example, the system management controller will wait until the temperature increases to a temperature that is above the safe power-on temperature of the fourth server component.

Block 516 restarts the server responsive to determining that the temperature is above the safe power-on temperature of the fourth server component or the server generally. As noted above, the fourth server component has the highest minimum operational temperature of the server components. Therefore, because the server components are sequentially ordered based on safe power-on temperatures, once the safe power-on temperature of the last server component is reached, the system management controller may determine that the operational temperature of the server has been reached and restart the server.

Continuing with the ongoing example, system management controller 112 determines whether the temperature is above the safe power-on temperature of fourth server component 414. System management controller 112 then restarts server 102 into a full operational boot responsive to determining that the temperature is above the safe power-on temperature of the fourth server component.

In example process 500, server components were described as being individually and sequentially powered on. It is to be appreciated, however, that multiple server components may be powered on at the same time. Furthermore, in some instances the order in which the server components are powered on may be based on one or more additional factors, such as a ratio of input power to amount of heat generated by the component. Furthermore, while the process above is described in reference to a server with four server components, it is to be appreciated that the process may be applied to a server with any number of server components.

Figure 6:
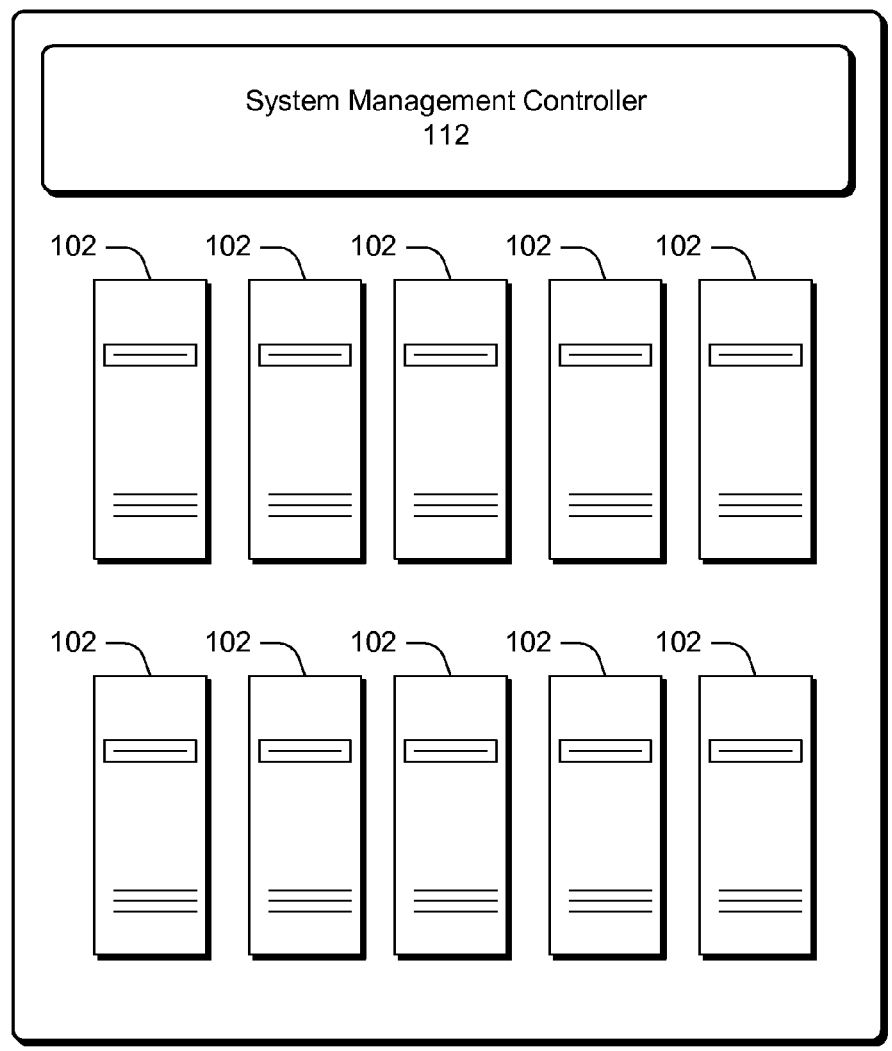
FIG. 6 illustrates an example container of servers in accordance with one or more embodiments.

In some embodiments the techniques discussed above may be used to start multiple servers in a container of servers when a temperature in the container is below the operational temperature range of the servers. Consider, for example, FIG. 6 that illustrates a container 600 that houses multiple servers 102 of FIG. 1. Servers 102 may be automatically started by system management controller 112 of FIG. 1 using the techniques described above. The system management controller may be located on one or more of servers 102 or separate and apart from servers 102, such as on a separate computing device.

Figure 7:
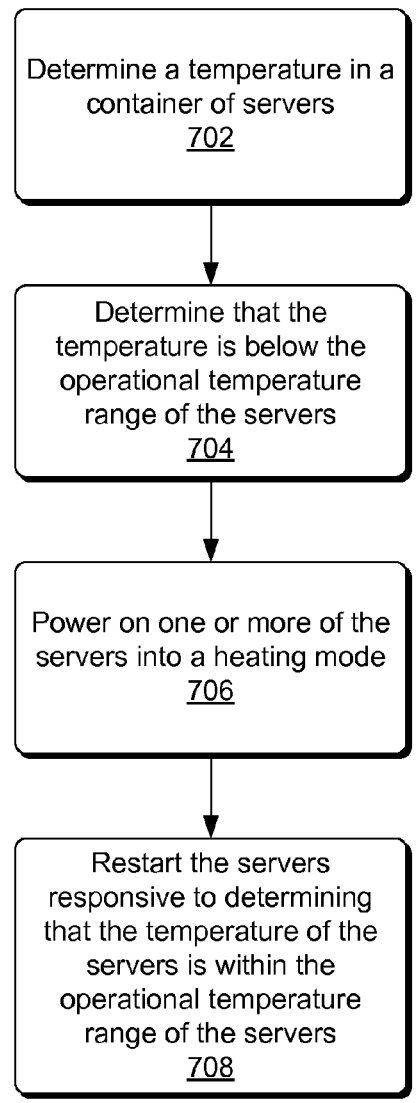
FIG. 7 is a flow diagram depicting an example process for automatically starting servers in a container of servers.

FIG. 7 is a flow diagram depicting an example process 700 for automatically starting servers in a container of servers. Process 700, for example, may be implemented by system management controller 112, once powered on and heated to an operational temperature as described above, to automatically start multiple servers 102 in container 600.

Block 702 determines a temperature in a container of servers. The temperature in the container of servers may be determined using information received from one or more temperature sensors. The temperature sensors may be located on the servers or located apart from the servers, such as at a location within the container. The temperature sensors may be configured to sense a temperature of the server itself and/or a temperature associated with the server, such as a temperature of the container in which the servers are located. Alternately or additionally, the temperature sensors may be configured to sense a temperature of one or more server components. For instance, a temperature sensor may be associated with individual server components and configured to sense a temperature of the individual server components. By way of example, consider process 700 in the context of container 600. System management controller 112 determines, at block 702, a temperature of container 600 using temperature information received from one or more temperature sensors located on servers 102 or located in container 600 as described above in process 300.

Block 704 determines that the temperature is below the operational temperature range of the servers. Continuing with the ongoing example, system management controller 112 determines an operational temperature range for server(s) 102 and/or for server components on server(s) 102 and determines that the temperature determined at block 702 is below the operational temperature range, as described above in process 300.

Block 706 powers on one or more of the servers into a heating mode. Continuing with the ongoing example, system management controller 112 powers on one or more server(s) 102 into a heating mode as described above in processes 300 and 500. For example, system management controller 112 may sequentially power on individual server components on each server 102 into the heating mode. The power dissipated by the servers in the heating mode heats the container.

In some embodiments, the system management controller may power on the same server components on each server at the same time. For example, the system management controller may power on a first component on each server concurrently. In other embodiments the system management controller may power on different server components on different servers at different times. For example, the system management controller may power on a first component on a first server and then power on a second component on a second server at a later time. It is to be appreciated, therefore, that the system management controller may selectively power on any combination of servers and server components in the heating mode to heat the container of servers in accordance with the techniques described above.

Block 708 restarts the servers responsive to determining that the temperature of the servers is within the operational temperature range of the servers. Continuing with the ongoing example, system management controller 112 restarts server(s) 102 responsive to determining that the temperature in the container is within the operational temperature range of the servers. To restart the servers, system management controller 112 restarts the servers into a full operational boot. In some embodiments the servers may be restarted individually as the temperature of each individual server reaches the operational temperature range. As each individual server is restarted, the power dissipated by each individual server may heat the container. Alternately, in some embodiments all of the servers in the container of servers are restarted at the same time when the temperature of the container of servers is within the operational temperature range of the servers. It is to be appreciated, therefore, that the system management controller may selectively restart any combination of servers at varying times in accordance with the techniques described above.

Conclusion

This document describes various techniques for automatically starting servers at low temperatures. A server may be powered on into a heating mode responsive to determining that a temperature of the server is below an operational temperature range. In the heating mode, server components that may be safely operated at low temperatures may be selectively powered on to heat the server. The server may then be restarted into a full operational boot when the temperature of the server has increased to a temperature that is within the operational temperature range. In some embodiments these techniques may be used to start multiple servers in a container of servers when a temperature in the container is below the operational temperature range.

What is claimed is:

1. A computer storage device having computer-executable instructions stored thereon that, when executed by a processor, perform a method comprising:
    determining that a first temperature of a server is below an operational temperature range of the server;
    sending a command to power on a server component into a heating mode to heat the server responsive to determining that the first temperature is below the operational temperature range of the server, the server component comprising a power supply, a processor, a clock, a memory, or a storage device;
    determining, responsive to the server component being in the heating mode for some amount of time, that a second temperature of the server is within the operational temperature range; and
    restarting the server responsive to determining that the second temperature is within the operational temperature range of the server, the server being below the operational temperature range if the server is below a minimum operational temperature of a server component with a highest minimum operational temperature of all server components of the server.

2. The computer storage device of claim 1, wherein the server component is configured to operate in the heating mode without damaging the server component and without damaging any additional server components of the server.

3. The computer storage device of claim 1, wherein the instructions, when executed by the processor, perform a method further comprising sending one or more additional commands to power on one or more of the additional server components into the heating mode to heat the server.

4. The computer storage device of claim 1, wherein the server component does not perform computations in the heating mode.

5. The computer storage device of claim 1, wherein restarting the server comprises restarting the server into a full operational boot.

6. The computer storage device of claim 1, wherein the instructions, when executed by the processor, perform a method further comprising sending one or more additional commands to power on one or more server heaters on the server, the one or more server heaters configured to generate heat to increase the temperature when powered on.

7. A computer storage device having computer-executable instructions stored thereon that, when executed by a processor, perform a method comprising:
determining that a first temperature in a container of servers is below an operational temperature range of the servers;
powering on one or more of the servers in the container of servers into a heating mode to heat the container of servers responsive to determining that the first temperature is below the operational temperature range of the servers;
determining, responsive to the one or more servers being in the heating mode for some amount of time, that a second temperature in the container of servers is within the operational temperature range of the servers; and
restarting the servers responsive to determining that the second temperature is within the operational temperature range of the servers.

8. The computer storage device of claim 7, wherein powering on the one or more servers into the heating mode comprises selectively powering on one or more server components of the one or more servers into the heating mode.

9. The computer storage device of claim 7, wherein the one or more servers do not perform computations in the heating mode.

10. A method comprising:
receiving, at a system management controller implemented by a processor at a server, a command to start the server;
powering on the system management controller of the server; and
heating the system management controller to an operational temperature range to enable the system management controller to initiate an automatic start-up of the server, the system management controller configured to heat itself to the operational temperature range.

11. The method of claim 10, further comprising heating the system management controller to a safe power-on temperature range prior to powering on the system management controller.

12. The method of claim 10, wherein the system management controller, when heated to the operational temperature range, is configured to initiate the automatic start-up of the server by:
determining that a first temperature of the server is below an additional operational temperature range of the server;
sending a command to power on a server component into a heating mode to heat the server responsive to determining that the first temperature is below the additional operational temperature range of the server;
determining, responsive to the server component being in the heating mode for some amount of time, that a second temperature of the server is within the additional operational temperature range; and
restarting the server responsive to determining that the second temperature is within the additional operational temperature range of the server.

13. The method as recited in claim 12, wherein prior to restarting the server, the system management controller is configured to send one or more additional commands to power on one or more additional server components into the heating mode to heat the server.

14. The method as recited in claim 13, wherein the system management controller is further configured to determine that a third temperature of the server is above a safe power-on temperature of the one or more additional server components prior to powering on the one or more additional server components into the heating mode.

15. The method as recited in claim 13, wherein the system management controller is further configured to sequentially power on the one or more additional server components into the heating mode using an ordered list of server components that is ordered based at least in part on safe power-on temperatures of the one or more additional server components.

16. The method as recited in claim 12, wherein the server is below the operational temperature range if the server is below a minimum operational temperature of a server component with a highest minimum operational temperature of all server components of the server.

17. The method as recited in claim 12, wherein the system management controller is configured to restart the server by restarting the server into a full operational boot.

18. The computer storage device of claim 7, wherein the one or more servers are configured to operate in the heating mode without damaging server components of the one or more servers.

19. The computer storage device of claim 7, wherein restarting the servers comprises restarting the servers into a full operational boot.

* * * * *